United States Patent [19]

Sadowski et al.

[11] 4,412,812

[45] Nov. 1, 1983

[54] VERTICAL SEMICONDUCTOR FURNACE

[75] Inventors: Joseph P. Sadowski, Coppell; Alan E. Lightfoot, Dallas; Jeffrey M. Kowalski, Coppell, all of Tex.

[73] Assignee: Mostek Corporation, Carrollton, Tex.

[21] Appl. No.: 335,170

[22] Filed: Dec. 28, 1981

[51] Int. Cl.³ .................. F27B 9/00; F27B 3/22; F27D 5/00
[52] U.S. Cl. .................. 432/121; 432/11; 432/26; 432/253
[58] Field of Search .................. 432/11, 26, 253, 258, 432/121; 29/569

[56] References Cited

U.S. PATENT DOCUMENTS

| | | | |
|---|---|---|---|
| 3,183,130 | 5/1965 | Reynolds et al. | 432/253 |
| 3,493,220 | 2/1970 | Kagdis et al. | 432/11 |
| 3,737,282 | 6/1973 | Hearn et al. | 432/253 |
| 3,811,825 | 5/1974 | Enderlein | 432/253 |
| 4,153,164 | 5/1979 | Hofmeister et al. | 432/258 |

*Primary Examiner*—John J. Camby

[57] ABSTRACT

A furnace (100) is provided which aids in the reduction of polysilicon and quartz contaminants during polysilicon deposition on monocrystalline wafers. The wafers are heated for polysilicon deposition within the interior of a quartz tube (102) which is mounted so that the interior sidewalls are vertical and the tube opening is at the top of the furnace. A quartz boat (104) is adapted for carrying the wafers in a spaced apart relationship with a quartz rod (144) maintaining the wafers within the boat when it is suspended vertically from an elevator bar (128). The elevator bar moves the quartz boat vertically into the interior of the quartz tube (102) for heating without contact between the quartz boat and sidewalls of the quartz tube. The level of contamination is therefore less and the yield of certain integrated circuits much improved.

3 Claims, 17 Drawing Figures

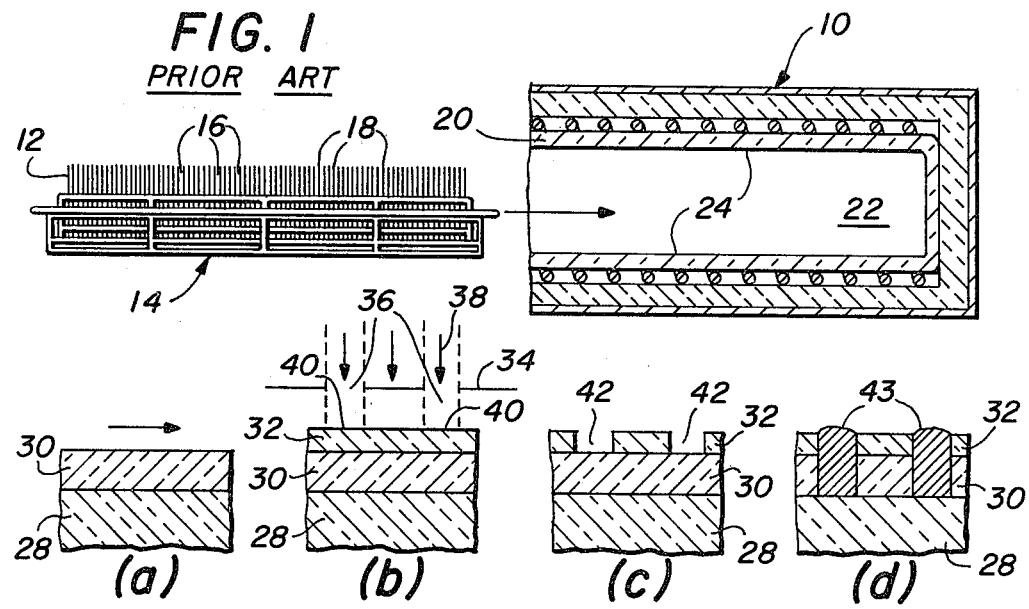
FIG. 1 PRIOR ART
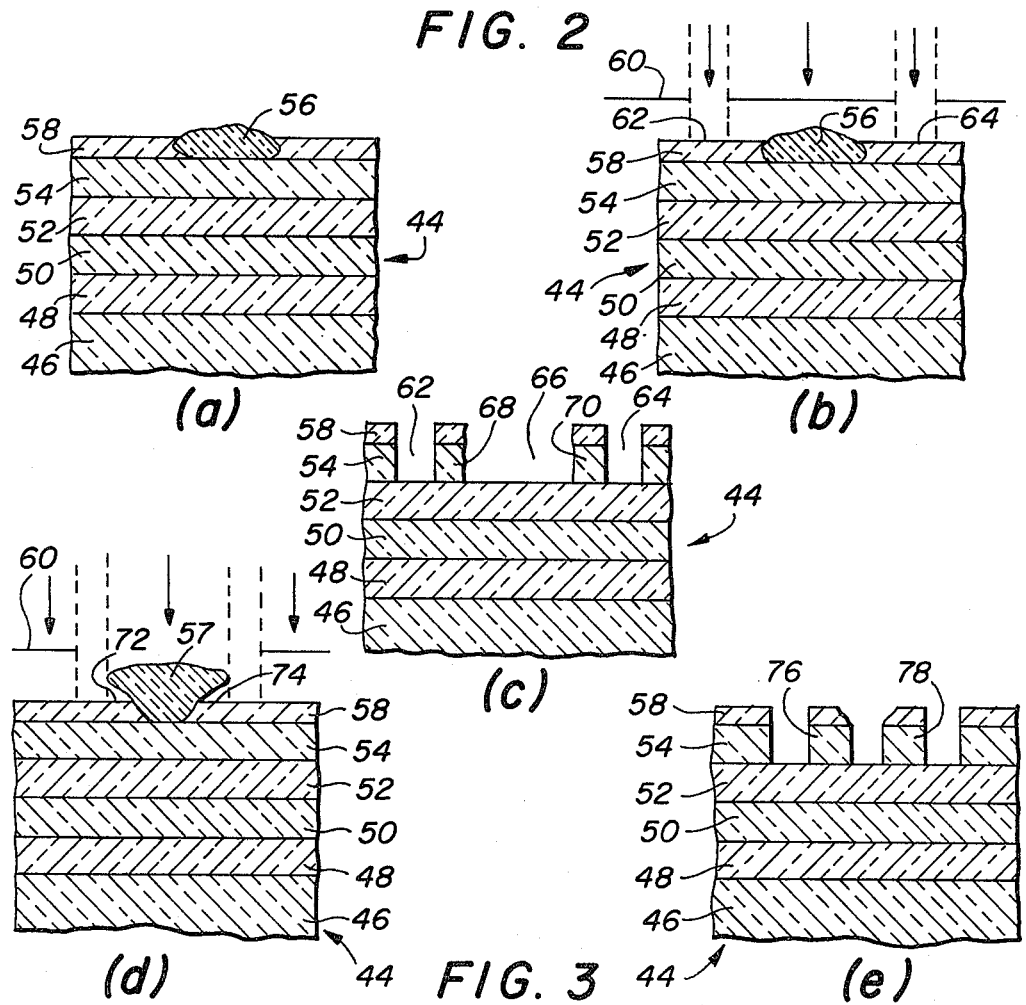
FIG. 2
FIG. 3

4,412,812

VERTICAL SEMICONDUCTOR FURNACE

TECHNICAL FIELD

This invention relates to the production of semiconductor devices, and in particular to the deposition of materials on a substrate.

BACKGROUND OF THE INVENTION

Integrated circuit devices are created by a multistep sequence of operations. A monocrystalline silicon wafer having a relatively large diameter, such as three or four inches, is used as the substrate. The wafer can undergo several steps of polycrystalline silicon deposition at elevated temperatures in a furnace. The polycrystalline silicon, commonly referred to as "poly", is deposited on the wafer from a gas passing over the wafer including silane ($SiH_4$).

In the typical construction, an oxide layer will be formed on the silicon wafer prior to poly deposition and between other added layers of semi-conductor material. The oxide layers are substantially nonconductive and act as an insulator between the substrate and poly layer or between two poly layers.

To form holes at selected areas through the oxide layer to permit electrical communication between semiconductor layers, the oxide layer is coated with a "photoresist" material. This photoresist material is responsive to light, and in particular ultraviolet light. A photomask is prepared from the original design for the integrated circuit which comprises a photographic negative having light transparent and opaque regions tracing the desired circuit design. The mask is placed over the photoresist and a light is shown through the photomask to initiate a chemical change in the portions of the photoresist under the transparent regions of the photomask. It is then possible to wash away either the portions of the photoresist exposed to light or that not exposed to light. Whichever technique is employed, the elimination of the photoresist in certain regions permits direct exposure of the underlying oxide layer. The underlying oxide layer may then be etched in these regions by etchant, such as acids. This provides exposure of the semiconductor region beneath the oxide at selected regions on the surface of the integrated circuit. A conductive metal may then be deposited on the surface with the metal flowing into electrical contact with the underlying semiconductor region. Similar procedures can be used to form selected holes or gaps in the semiconductor layers to form discrete "islands" of semi-conductor material. A sequence of steps will build the semiconductor and oxide layers and interconducting metal conductors to form the complete integrated circuit chip.

In the past, the poly layer has been deposited on a substrate in a furnace heated above 800° F. A silane rich gas is passed over the heated wafers in the furnace to deposit the poly layer. The wafers are mounted on a quartz boat and inserted into a quartz tube within the oven. Metal cannot be used in any area proximate the wafer as metal contaminants will diffuse into the wafer. However, the yield of operating integrated circuits from each circuit undergoing preparation is far less than 100%. With the cost of production, a need exists to improve the yield to reduce the final product cost.

SUMMARY OF THE INVENTION

In accordance with one aspect of the invention, an improved furnace is provided. The improved furnace is used to heat integrated circuit materials with the materials being carried by a quartz boat for insertion into the furnace within a quartz lined chamber for heating. The improved furnace includes structure for inserting the quartz boat within the quartz lined chamber without contact therebetween to control the level of contaminants within the chamber and on the integrated circuit materials inserted within the chamber and on the integrated circuit materials inserted within the chamber.

In accordance with another apsect of the present invention, an improved furnace for heating integrated circuit materials is provided. The materials are carried by a quartz boat for insertion into the furnace within a quartz lined chamber through an opening. The improved furnace includes structure for supporting and vertically lowering the quartz boat through the opening into the chamber without contact between the boat and chamber walls to control the level of contaminants within the chamber and on the integrated circuit materials.

In accordance with yet another aspect of the present invention, an improved method of heating an integrated circuit material is provided. The material is carried by a quartz boat and is heated within a quartz lined compartment within a furnace. The method includes the step of inserting the boat within the compartment without contact between the boat and the walls to control contaminants within the furnace and on the materials.

BRIEF DESCRIPTION OF THE DRAWINGS

A more complete understanding of the invention may be had by reference to the following Detailed Description when taken in conjunction with the accompanying Drawings, wherein:

FIG. 1 is a side cross-sectional view of the prior art furnace in which frictional contact is made between the boat and lining of the furnace to create contaminants;

FIGS. 2a through 2d are cross sectional illustrations of the preparation of a single poly layer integrated circuit device;

FIGS. 3a–3e are cross sectional illustrations of the steps in producing a two poly layer integrated circuit device and illustrating the creation of shorts and open circuits between the poly layers due to contaminants in the furnace;

DETAILED DESCRIPTION

Figure 4:
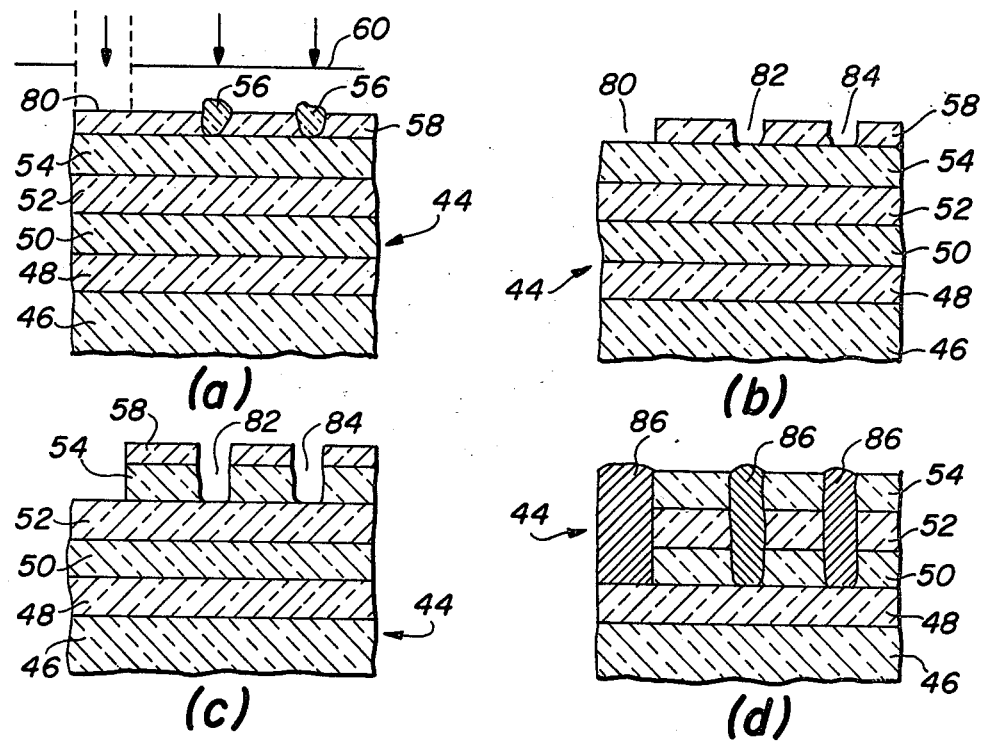
FIGS. 4a–4d illustrate in cross section the preparation of a two poly layer integrated circuit device and illustrates the creation of a short between portions of one of the poly layers through contamination in the furnace.

Referring now to the drawings, wherein like reference characters designate like or corresponding parts throughout several views, FIG. 1 illustrates a furnace 10 as currently employed to deposit poly layers on monocrystalline silicon wafers 12. A quartz boat 14 holds a number of wafers 12 in a fixed vertical orientation with separations 16 between each wafer. The wafers 12 are typically circular having a diameter of several inches with one flattened edge 18 to orient the wafer during processing.

The furnace 10 includes a quartz tube 20 which defines a chamber 22 for insertion of the boat 14. The boat 14 is slid on the inner lining 24 of the furnace to move the boat into the chamber 22. Boat 14 can even have wheels to roll into the chamber.

After placement of the boat 14 within the furnace, the chamber 22 is evacuated. A lid covers the entrance of the tube 20 and is sealed against an O ring when the chamber 22 is evacuated to maintain the vacuum.

The furnace is heated to approximately 650° C. A silane rich gas is then entered at one end of the chamber 22 and passed over the wafers 12 and through the separations 16 between the wafers. The silane decomposes in the vacuum and forms a polysilicon layer of a predetermined thickness on the wafers 12. As the gas passes by and between the wafers, the gas becomes silane depleted. The furnace temperature at the regions exposed to the depleted silane gas can be elevated to increase the efficiency of deposition of the poly layer to compensate for the depletion. The operator of the furnace can control the gas flow, and gas pressure within the furnace to deposit a uniform thickness of poly on all the wafers 12.

FIGS. 2a-d illustrate typical steps in the forming of a completed integrated circuit. Oxygen is passed over the outer surface of a silicon substrate 28 to form a silicon dioxide layer 30. The layer 30 is nonconductive and forms an insulator.

In FIG. 2b, a "positive" photoresist layer 32 has been applied on top of layer 30. A typical thickness of this layer is 0.5 microns. The photoresist forming layer 32 reacts chemically to an exposure of light, in particular ultraviolet light. A photomask 34 is positioned over the photoresist 32. The photomask 34 includes transparent areas 36 which permit passage of light 38 for incidence on certain portions 40 of the photoresist layer 32.

The photoresist layer 32 is then washed by appropriate chemicals to wash away portions 40, leaving the portions of the photoresist not exposed to light 38 in place. The photoresist may also be of the "negative" type where a portion exposed to light is retained after washing and the portions not exposed are washed away.

It can readily be seen that gaps 42 are created after the wash which expose portions of the oxide layer 30. A chemical etchant, such as acid, is then used to etch away the exposed portions of the oxide layer 30 to expose portions of the substrate 28. The photoresist layer 32 is resistant to the etchant and will protect the oxide layer beneath the photoresist layer. The photoresist layer 32 is then completely removed by another process. Finally, a metal 43, such as aluminum or gold, may be deposited to form electrical conductors in contact with the exposed portions of the substrate 28. Further silicon and oxide layers can be built up to any extent desired to create a complete integrated circuit.

In examining integrated circuits undergoing poly deposition in furnaces such as furnace 10, a large number of contaminants predominantly ranging in size from one to ten microns were found to be embedded in or extending from the deposited poly layer. These contaminants were found to be formed of quartz particles created by friction between the quartz boat 14 and inner lining 24 of the quartz tube 20 as the boat is slid into the furnace. The contaminants were also found to include particles of poly from poly layers deposited on the inner lining from previous poly deposition steps. These poly contaminants were again created by the friction between the quartz boat and lining 24 as the boat is slid into the furnace.

The presence of the contaminants creates at least two distinct problem modes in the manufacture of integrated circuits. The first problem mode is shorting or an open circuit between regions of a single poly layer which were to be isolated electronically or connected, respectively. The second problem mode comprises shorting between two separate layers of poly which again were designed to be isolated electronically.

The development of the first problem mode is best described with reference to FIGS. 3a-e. FIG. 3a illustrates an integrated circuit 44 having a substrate 46 with an oxide layer 48. A first poly layer 50 is deposited above layer 48 and has an oxide layer 52. A second poly layer 54 is deposited above oxide layer 52. Contaminant 56 is shown which lies within or on top of the second poly layer 54. A photoresist layer 58 is then placed over the second poly layer 54.

The contaminant 56 extends above the surface of the photoresist layer 58. The contaminant 56 can cause shorts or open circuits in portions of the poly layer 54 depending upon whether the photoresist 58 is positive or negative. A positive photoresist 58 is used in the construction of the integrated circuit 44 shown in FIG. 3b. The photomask 60 permits light to fall on regions 62 and 64 of the photoresist. A chemical reaction then occurs which permits the photoresist in regions 62 and 64 to be washed away and the underlying poly layer 54 to be etched down to the oxide layer 52 as shown in FIG. 3c. However, the contaminant 56 does not protect the underlying poly layer 54 during the etching as does the unexposed photresist 58. The poly layer 54 is therefore etched away in the region 66 which was covered by the contaminant as seen in FIG. 3c. This can cause an open circuit between the poly regions 68 and 70 and cause failure of the integrated circuit.

A positive photoresist 58 is applied to the integrated circuit 44 illustrated in FIG. 3d. The photoresist layer 58 is exposed to light through photmask 60 in a region including contaminant 57. As can be seen, the contaminant 57 blocks the light from reaching regions 72 and 74 of photoresist 58.

After washing and etching, the integrated circuit appears as illustrated in FIG. 3e. The poly layer 54 underneath the photoresist exposed to light has been etched away to the oxide layer 52 with the exception of two pillars 76 and 78 remaining under the photoresist hidden from the light by the contaminant 57. The pillars 76 and 78 can create a short between regions of the poly layer which were designed to be electrically independent.

The use of a negative photoresist results in an identical problem mode. When the negative photoresist is exposed to light, it is retained after a wash. The unexposed negative photoresist is washed away. If photoresist 58 in FIG. 3d was a negative photoresist, the contaminant 57 would prevent exposure of the photoresist below contaminant 57 and result in a possible open circuit.

The poly to poly mode failure is illustrated in FIGS. 4a-d. In this failure mode, contaminants 56 are present extending through and out of the photoresist layer 58. A positive photoresist layer 58 is employed and a region 80 is exposed to light through the photomask 60.

When the integrated circuit 44 is washed, the photoresist in region 80 is removed. However, in addition to region 80, the regions 82 and 84 where contaminants 56 were expose areas of the poly layer 54 as shown in FIG. 4b. When an etchant is used to etch poly layer 54 in region 80, the poly layer 54 in regions 82 and 84 that were beneath the contaminants are also etched away as no photoresist protects these regions as seen in FIG. 4c.

The next step of preparation involves etching the oxide layer 52 in the region 80. However, the absence of photoresist in regions 82 and 84 also etches the oxide layer in these regions. Finally, a metal conductor 86, such as aluminum, is deposited in the region 80 to electrically connect the poly layers 50 and 54 in region 80. However, the metal will also be deposited at regions 82 and 84 and will result in a short between the two poly layers at locations which were to be electrically isolated. Neither poly layers 50 nor 54 are typically continuous across the entire integrated circuit 44. Therefore, the unintentional short between poly layers will lead to failure of the integrated circuit.

Several unsuccessful techniques for substantially reducing the contaminant level in furnaces were tried. A quartz boat with rollers was used with a cover or protective layer over the wafers while entering the furnace to form a "covered wagon" to keep contaminants off the wafers. This was not found successful. An uncontaminated or "clean" quartz liner was installed before and after pushing and pulling the boat into and out of the furnace. This was expensive and didn't sufficiently reduce contaminant levels. The same results occur when the quartz tube is replaced more often to reduce poly buildup on the inner lining. Reducing the speed of insertion and removal from the furnace was also not found effective. Finally, attempts were made to vacuum or blow out contaminants from previous furnace cycles. Again, these were unsuccessful in keeping contaminants off the wafers.

Figures 5, 6:
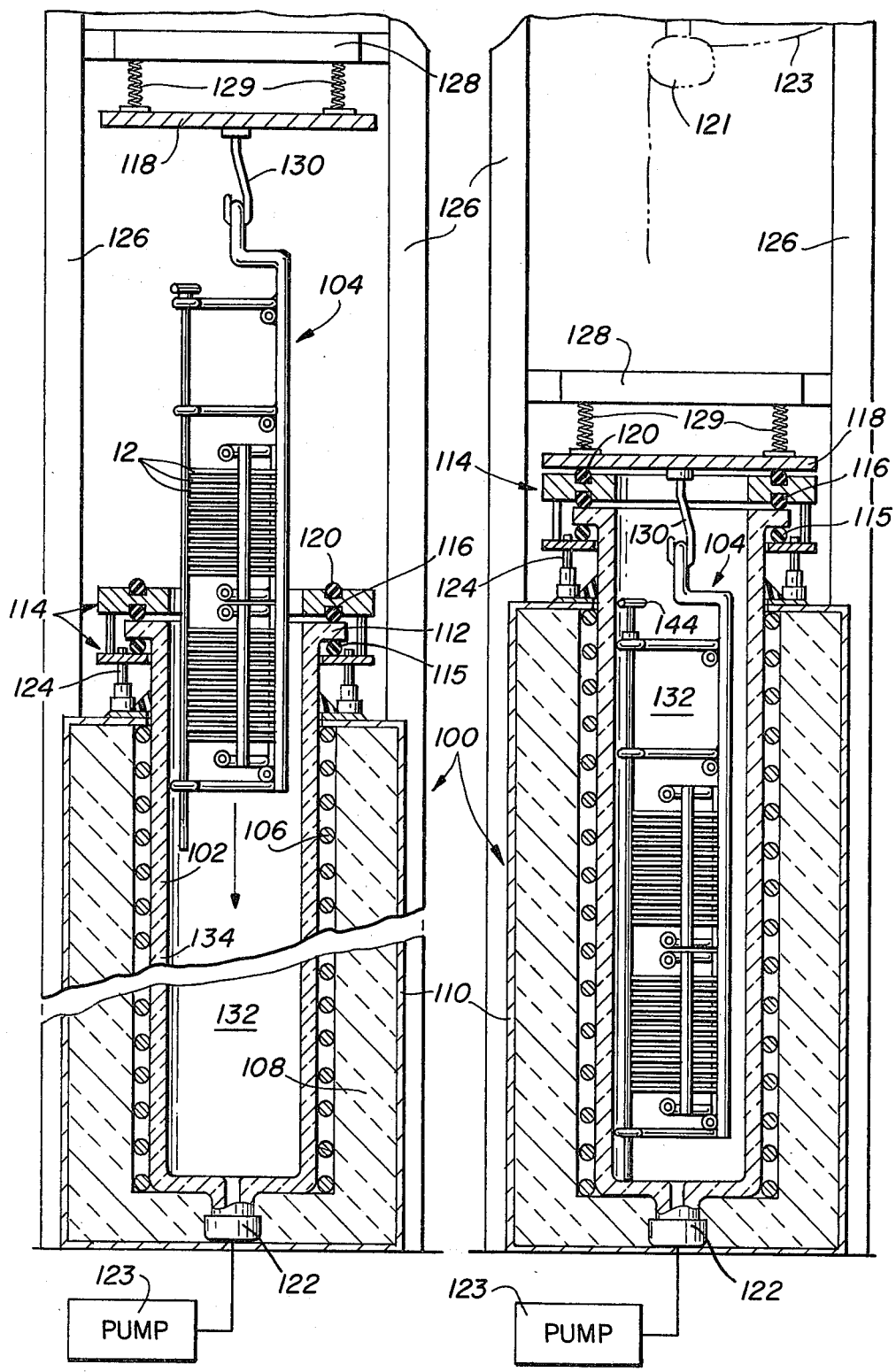
FIG. 5 is a vertical cross sectional view of a first embodiment of the present invention showing a vertical furnace and apparatus for lowering the boat into the furnace vertically without contact between the boat and furnace lining with the boat being lowered into the furnace.
FIG. 6 is a vertical cross sectional view of the vertical furnace with the boat in the furnace.

An improved furnace 100 shown in FIGS. 5 and 6 forms a first embodiment of the present invention and permits a significant reduction in the contaminants present during poly deposition. The furnace includes a quartz tube 102 supported vertically for receiving a quartz boat 104 containing a number of wafers 12. The quartz tube 102 is surrounded by suitable heating structure such as RF heating coils 106 for heating the tube. The coils, in turn, are surrounded by insulation 108 and the furnace includes an outer housing 110. The furnace preferably includes provisions for adjusting the temperature in at least three regions along the length of the quartz tube to provide sufficient versatility to have a uniform poly deposition.

The upper end of the quartz tube 102 has an annular rim 112 which fits within an appropriate space in a metal collar 114. A cushion 115 supports the rim 112 and O-ring seal 116 seals between the collar 114 and the tube 102. The collar 114 is adapted to receive a cover 118 in sealing engagement therewith through an O-ring seal 120 as shown in FIG. 6 after the boat has been lowered within the quartz tube. The lower end of the quartz tube 102 is provided with a vacuum nipple 122 for attachment to vacuum pump 123 to evacuate the tube. Suitable gas inlets for silane rich gas or other process gases may be provided in manifolding in the annular collar 114 for entry into the interior of the quartz tube 102. For adjustment, four threaded rods 124 support the collar and tube above the housing of the furnace and are adjusted to minimize stresses within the tube in supporting it in a vertical position.

Elevator rails 126 extend upwardly from the top of the furnace which support an elevator bar 128 for vertical motion. The cover 118 is mounted to the bar 128 through four springs 129 at each corner of the cover. A hook 130 depends from the cover 118 for supporting the quartz boat 104. The bar 128 is moved downward on rails 126 and the boat is lowered into the interior 132 of the quartz tube 102 without contact with the inner wall 134 of the tube or the bottom of the tube. The bar 128 is lifted to remove the boat 104 from the interior 132 also without contact between the boat 104 and inner wall 134. Therefore, no frictional generation of quartz or poly contaminants is possible.

When the boat has been properly positioned in the interior 132, the lid is positioned to close the top opening of the quartz tube 102 as seen in FIG. 6. When the interior 132 is evacuated, the cover is sealed against the O-ring seal 120 by the internal vacuum as seen in FIG. 6. The springs 129 permit the cover 118 to seal evenly on O-ring 120 to comensate for any misalignment of the components. When the deposition process is finished, the bar 128 is moved upward to pull cover 118 off the furnace and lift the boat 104 from the interior 132. The rate of vertical motion of bar 128 in both lowering and raising is fully controllable. In an alternate construction, a pully 121, shown in phantom line in FIG. 6, is suspended above the top of the furnace with a cable 123 running through the pulley to cover 118 for lowering the boat 104 and cover 118.

Figure 7:
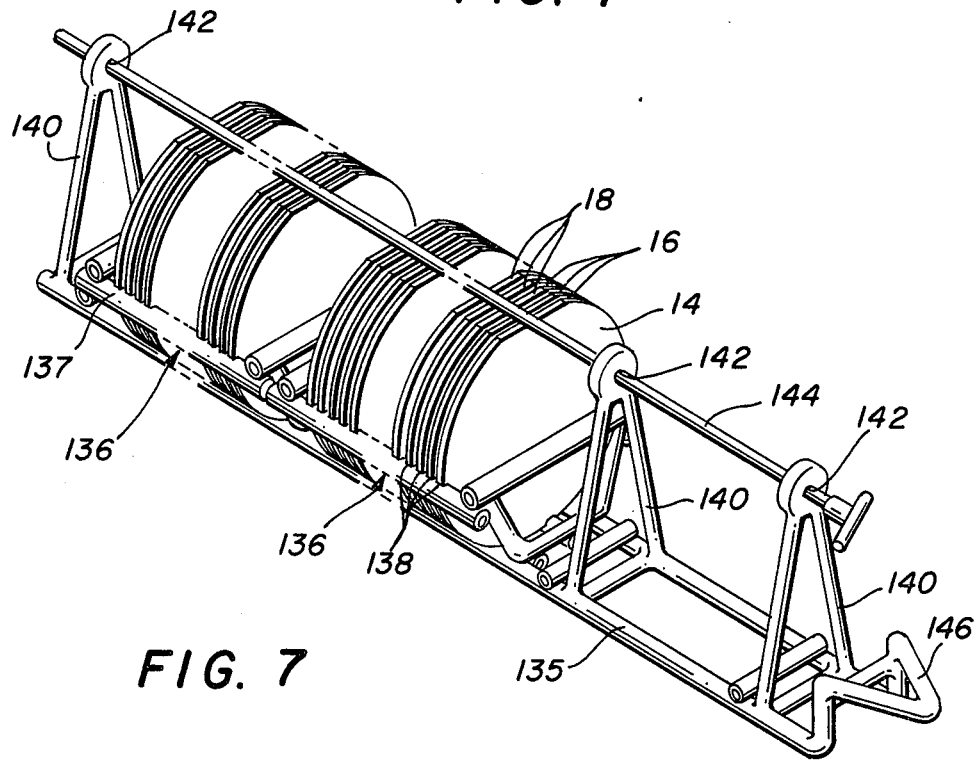
FIG. 7 is a perspective view of a quartz boat employed in the first embodiment of the present invention.

The quartz boat 104 is best described with reference to FIG. 7. The boat is formed entirely of quartz and includes a frame 135 supporting one or more semicylindrical portions 136. Portions 136 can be removed from frame 135 and are constructed of rods 137. Each of the rods 137 has a series of slots 138 formed on its inner surface along its length for receiving the edges of wafers 12. Frame members 140 extend upwardly from each end of the frame 135 and include apertures 142 for passage of a quartz T-handled rod 144.

The apertures and rod are sized so that when the wafers 12 are inserted in slots 138 with the flattened edge 18 proximate the rod 144, the rod contacts the edge to prevent motion of the wafers. The quartz boat 104 therefore holds the wafers with a fixed separation 16 when the boat is oriented vertically for entry into the furnace. A quartz hook 146 is provided on frame 135 for attachment to the hook 130 on bar 128. The quartz boat 104 further permits the largest surface areas of the wafers to be perpendicular to the incoming gas flow through the annular collar 114.

In one furnace constructed in accordance with the teachings of the present invention, a modified model MB-80 "MiniBrute" oven manufactured by Thermco Product Corp. of Orange, Calif. 92688 was supported vertically. In microscopic examination after poly deposition in this furnace, the contaminant density on wafers was found to be reduced by more than half that typically found in prior art furnaces after poly deposition. A three fold increase in yield of functional "very large integration" (VLSI) circuits with double poly layers was found when the circuits were processed with the improved furnace over the yield normally encountered when processed in the standard prior art furnace.

The reduction of contamination is critical to semiconductor furnace operations other than poly deposition. Furnaces incorporating the advantages of the present invention can also be used in furnace operations where the operations are chemical vapor deposition, thermal oxide growth, an anneal, an alloy or a diffusion. Also, it is possible to move the furnace with the quartz tube about the wafers for deposition by raising the entire furnace from a position below the wafers. It is also possible to rotate the furnace 180° about a vertical axis so that the wafers are raised up from below into the furnace for deposition, rather than lowered down into the furance from above.

Although a single embodiment of the invention has been illustrated in the accompanying Drawings and described in the foregoing Detailed Description, it will be understood that the invention is not limited to the embodiment disclosed, but is capable of numerous rearrangements, modifications and substitutions of parts and elements without departing from the spirit of the invention.

We claim:

1. A furnace for heating integrated circuit maerials, comprising:
    a housing;
    a quartz tube defining a cylindrical interior with vertical sidewalls and having a rim at its upper ends surrounding an opening into the interior and a port through its lower end for evacuating the interior;
    a mounting plate secured to said housing through a plurality of adjustment screws and supporting said quartz tube about its rim;
    a manifold secured in sealing relationship with said quartz tube about the opening thereof and further having an aperture therethrough aligned with the opening in said tube;
    a cover for sealing engagement with said manifold to seal the interior of said quartz tube from the atmosphere;
    heating means for heating the interior of said quartz tube;
    a quartz boat for holding the integrated circuit materials for entering into the interior of said quartz tube; and
    means for supporting and vertically moving said quartz boat into and out of the interior of said tube without contact between the sidewalls of the quartz tube and said quartz boat.

2. The furnace of claim 1 wherein said means for supporting and vertically moving said quartz boat comprises:
    parallel vertical rails extending upwardly from the opening in said quartz tube and on either side thereof;
    an elevator slidably supported on said pair of rails for both upward and downward vertical motion, said elevator resiliently suspending said cover therefrom;
    means for raising and lowering said elevator; and
    hook means secured to said cover for vertically suspending said quartz boat for inserting and removing the boat from the interior of said quartz tube as the elevator is moved vertically.

3. The furnace of claim 1 wherein said quartz boat comprises:
    a frame having a centrally located hook at one end thereof for attachment to said hook means on said means for supporting and lowering;
    at least one semicylindrical section having slots formed on the inner surface thereof for accepting portions of the material to be heated, said section being positionable on said frame; and
    a quartz rod adapted for placement on said frame on the side of the material opposite the semicylindrical section to maintain the material within the semicylindrical section during vertical motion.

* * * * *